United States Patent
Abe

(10) Patent No.: US 12,528,105 B2
(45) Date of Patent: Jan. 20, 2026

(54) SAW MODULE, FLAVOR INHALER, AND METHOD FOR MANUFACTURING SAW MODULE

(71) Applicant: Japan Tobacco Inc., Tokyo (JP)

(72) Inventor: Yuki Abe, Tokyo (JP)

(73) Assignee: JAPAN TOBACCO INC., Tokyo (JP)

( * ) Notice: Subject to any disclaimer, the term of this patent is extended or adjusted under 35 U.S.C. 154(b) by 975 days.

(21) Appl. No.: 17/700,739

(22) Filed: Mar. 22, 2022

(65) Prior Publication Data

US 2022/0212231 A1    Jul. 7, 2022

Related U.S. Application Data

(63) Continuation of application No. PCT/JP2020/032308, filed on Aug. 27, 2020.

(30) Foreign Application Priority Data

Oct. 8, 2019    (JP) .................. 2019-185128

(51) Int. Cl.
*B06B 1/06*    (2006.01)
*A24F 40/05*    (2020.01)
(Continued)

(52) U.S. Cl.
CPC ............ *B06B 1/0662* (2013.01); *A24F 40/05* (2020.01); *A24F 40/70* (2020.01);
(Continued)

(58) Field of Classification Search
CPC ... B06B 1/0662; B06B 2201/77; A24F 40/05; A24F 40/70; A24F 40/10; A24F 47/00;
(Continued)

(56) References Cited

U.S. PATENT DOCUMENTS 5,260,913 A    11/1993    Kadota et al.
7,596,841 B2 *    10/2009    Yao .................... H10N 30/2043
29/25.35
(Continued)

FOREIGN PATENT DOCUMENTS

EP    3 777 583 A1    2/2021
JP    11-114467 A    4/1999
(Continued)

OTHER PUBLICATIONS

International Search Report (PCT/ISA/210) issued in PCT/JP2020/032308 mailed on Oct. 13, 2020.
(Continued)

*Primary Examiner* — Thomas Truong
(74) *Attorney, Agent, or Firm* — Birch, Stewart, Kolasch & Birch, LLP

(57)    ABSTRACT

A surface acoustic wave module (SAW module) includes a piezoelectric element substrate including a piezoelectric body, an IDT disposed on a front surface of the piezoelectric element substrate and including a comb-like electrode pair, and a coating layer covering the piezoelectric element substrate and the IDT. The coating layer is disposed on the front surface of the piezoelectric element substrate, an end surface of the piezoelectric element substrate, and a corner portion between the front surface of the piezoelectric element substrate and the end surface of the piezoelectric element substrate.

8 Claims, 8 Drawing Sheets

(51) Int. Cl.
    *A24F 40/70*          (2020.01)
    *B05B 17/06*          (2006.01)
    *H10N 30/02*         (2023.01)
    *H10N 30/88*         (2023.01)
    *A24F 40/10*          (2020.01)

(52) U.S. Cl.
    CPC ......... *B05B 17/0661* (2013.01); *H10N 30/02* (2023.02); *H10N 30/883* (2023.02); *A24F 40/10* (2020.01); *B06B 2201/77* (2013.01)

(58) Field of Classification Search
    CPC ............ B05B 17/0661; B05B 17/0607; B05B 17/0676; B05B 15/18; B05B 17/06; H10N 30/02; H10N 30/883; H03H 9/145; H03H 3/08; H03H 9/25
    See application file for complete search history.

(56) References Cited

U.S. PATENT DOCUMENTS

| | | | |
|---|---|---|---|
| 2002/0159242 A1* | 10/2002 | Nakatani | H01L 23/3107 29/841 |
| 2008/0129418 A1 | 6/2008 | Miura et al. | |
| 2010/0253326 A1* | 10/2010 | Koyilothu | G01R 33/091 324/207.21 |
| 2016/0001316 A1 | 1/2016 | Friend et al. | |
| 2016/0156331 A1* | 6/2016 | Miwa | H03H 3/08 29/25.35 |
| 2017/0178884 A1 | 6/2017 | Murtazin | |
| 2017/0201232 A1 | 7/2017 | Nakamura et al. | |
| 2017/0280771 A1 | 10/2017 | Courbat et al. | |
| 2019/0149123 A1 | 5/2019 | Sakashita | |
| 2021/0022391 A1* | 1/2021 | Minami | A61M 15/06 |

FOREIGN PATENT DOCUMENTS

| | | |
|---|---|---|
| JP | 2003-87094 A | 3/2003 |
| JP | 2008-73570 A | 4/2008 |
| JP | 2012-24646 A | 2/2012 |
| JP | 2016-513992 A | 5/2016 |

OTHER PUBLICATIONS

Extended European Search Report for European Application No. 20874221.3, dated Oct. 6, 2023.

Chinese Office Action and Search Report for Chinese Application No. 202080072678.4, dated May 17, 2025, with English translation.

\* cited by examiner

Fig. 6

| COATING THICKNESS ON FRONT SURFACE OF COATING LAYER (nm) | OCCURRENCE DURING THE DRIVING OF SAW MODULE | |
|---|---|---|
| | EXFOLIATION OF COATING LAYER | CRACK IN PIEZOELECTRIC ELEMENT SUBSTRATE |
| 0 (NO COATING) | - | × |
| 500 | × | ◎ |
| 600 | ○ | ◎ |
| 700 | ○ | ◎ |
| 800 | ○ | ◎ |
| 900 | ○ | ◎ |
| 1000 | ◎ | ◎ |
| 1200 | ◎ | ◎ |
| 1400 | ◎ | ◎ |
| 1500 | ◎ | × |
| 2000 | ◎ | × |
| 2500 | ◎ | × |

SAW MODULE, FLAVOR INHALER, AND METHOD FOR MANUFACTURING SAW MODULE

CROSS REFERENCE TO RELATED APPLICATIONS

The present application is a continuation application of International Application No. PCT/JP2020/032308, filed on Aug. 27, 2020 which claims priority under 35 U.S.C. 119 (a) to Patent Application No. 2019-185128, filed in Japan on Oct. 8, 2019, all of which are hereby expressly incorporated by reference into the present application.

TECHNICAL FIELD

The invention relates to saw modules, flavor inhalers, and methods for manufacturing saw modules.

BACKGROUND ART

A saw module has been known, in which a piezoelectric element substrate with an IDT (Interdigital Transducer) comprising a comb-like electrode pair is used to generate a surface acoustic wave (SAW) and thus atomize liquid (see Patent Literatures 1 and 2, for example).

A technology of using the saw module in a flavor inhaler has been suggested (see Patent Literature 3, for example). A technology of forming an insulating coating layer on the surface of an IDT has also been suggested (see Patent Literature 4, for example).

CITATION LIST

Patent Literature

PTL 1: Japanese Unexamined Patent Application Publication (Kokai) No. 2012-24646
PTL 2: Japanese Unexamined Patent Application Publication (Kohyo) No. 2016-513992
PTL 3: U.S. Pat. No. 2017/0280771
PTL 4: Japanese Unexamined Patent Application Publication (Kokai) No. 11-114467

SUMMARY OF INVENTION

Technical Problem

A first feature is a SAW module comprising a piezoelectric element substrate including a piezoelectric body, an IDT disposed on a front surface of the piezoelectric element substrate and comprising a comb-like electrode pair, and a coating layer covering the piezoelectric element substrate and the IDT. The coating layer is disposed on the front surface of the piezoelectric element substrate, an end surface of the piezoelectric element substrate, and a corner portion between the front surface of the piezoelectric element substrate and the end surface of the piezoelectric element substrate.

A second feature according to the first feature is that the coating layer has a thickness ranging from 600 nm to 1400 nm on the front surface of the piezoelectric element substrate.

A third feature according to the first or second feature is that, on the end surface of the piezoelectric element substrate, the coating layer has a thickness of 600 nm or more and the thickness of 50% or more of the thickness of the coating layer on the front surface of the piezoelectric element substrate.

A fourth feature according to any one of the first to third features is that, on the corner portion between the front surface of the piezoelectric element substrate and the end surface of the piezoelectric element substrate, the coating layer has a thickness of 600 nm or more and the thickness of 50% or more of the thickness of the coating layer on the front surface of the piezoelectric element substrate.

A fifth feature according to any one of the first to fourth features is that the coating layer includes either one of $SiO_2$ and SiN.

A sixth feature is a flavor inhaler comprising the SAW module according to any one of the first to fifth features.

A seventh feature is a method for manufacturing a SAW module, comprising the steps of forming a plurality of IDTs comprising a comb-like electrode pair on a front surface of a wafer of a piezoelectric element substrate including a piezoelectric body; cutting the wafer into module units; and forming a coating layer covering the piezoelectric element substrate that is cut and the IDTs. The step of forming the coating layer forms the coating layer on a front surface of the piezoelectric element substrate, an end surface of the piezoelectric element substrate, and a corner portion between the front surface of the piezoelectric element substrate and the end surface of the piezoelectric element substrate.

An eighth feature according to the seventh feature is that the step of forming the coating layer forms the coating layer by any one of a CVD method, an ALD method, and spray coating, A ninth feature according to the seventh or eighth feature is that the method for manufacturing a SAW module further comprises the step of applying processing for enhancing a hydrophilic property to the coating layer.

BRIEF DESCRIPTION OF DRAWINGS

FIG. 6 shows results of exfoliation of the coating layer and generation of a crack in the piezoelectric element substrate which are tested with respect to various thicknesses for the coating layer.

DESCRIPTION OF EMBODIMENTS

Embodiments will be discussed below. In the following explanation of the drawings, identical or similar elements are provided with identical or similar reference signs. It should be noted, however, that the drawings are schematic and that dimensional ratios and the like on the drawings may be different from actual ones.

Specific dimensions and the like should be determined in view of the following explanations. Needless to say, the drawings may differ from one another in terms of dimensional relationship and ratios.

SUMMARY OF DISCLOSURE

As mentioned under BACKGROUND ART, a technology of forming an insulating coating layer on a surface of an IDT has been suggested. However, when liquid is atomized on an end surface of a piezoelectric element substrate, a coating layer formed on a surface of IDT is sometimes exfoliated due to SAW vibration. If there is a microcrack in a front surface of the piezoelectric element substrate, a crack might be generated in the piezoelectric element substrate due to SAW vibration. A further improvement has therefore been desired in durability of SAW modules.

A SAW module according to the summary of disclosure comprises a piezoelectric element substrate including a piezoelectric body, an IDT disposed on the front surface of the piezoelectric element substrate and comprises a comb-like electrode pair, and a coating layer covering the piezoelectric element substrate and the IDT. The coating layer is disposed on the front surface of the piezoelectric element substrate, an end surface of the piezoelectric element substrate, and a corner portion between the front surface of the piezoelectric element substrate and the end surface of the piezoelectric element substrate.

According to the summary of disclosure, the coating layer is disposed on the front surface of the piezoelectric element substrate, the end surface of the piezoelectric element substrate, and a corner portion between the front surface of the piezoelectric element substrate and the end surface of the piezoelectric element substrate. This suppresses exfoliation of the coating layer and generation of a crack in the piezoelectric element substrate and thus improves the SAW module in durability.

Embodiments (SAW Module)

Figure 1:
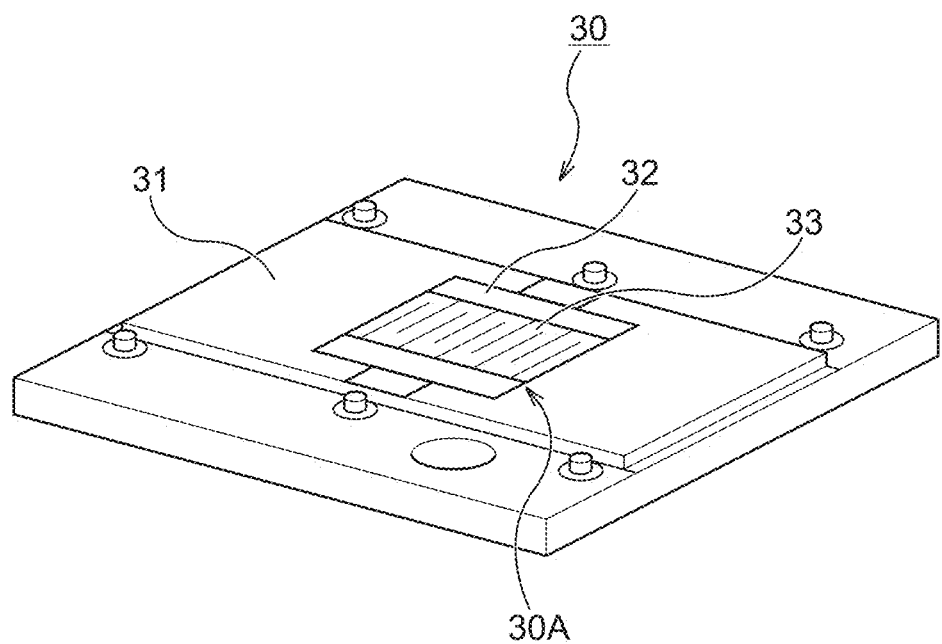
FIG. 1 shows a SAW module according to an embodiment.
Figure 2:
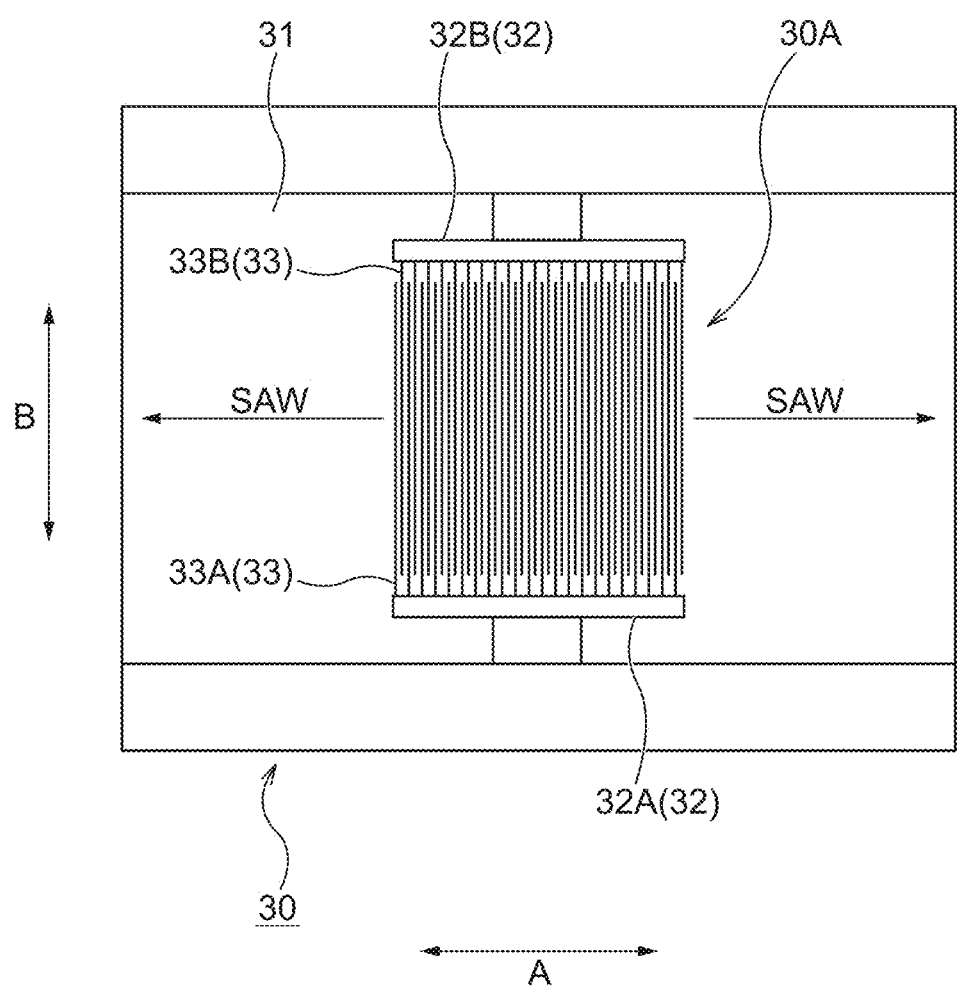
FIG. 2 is a planar view of the SAW module as viewed from a front surface side of a piezoelectric element substrate.
Figure 3:
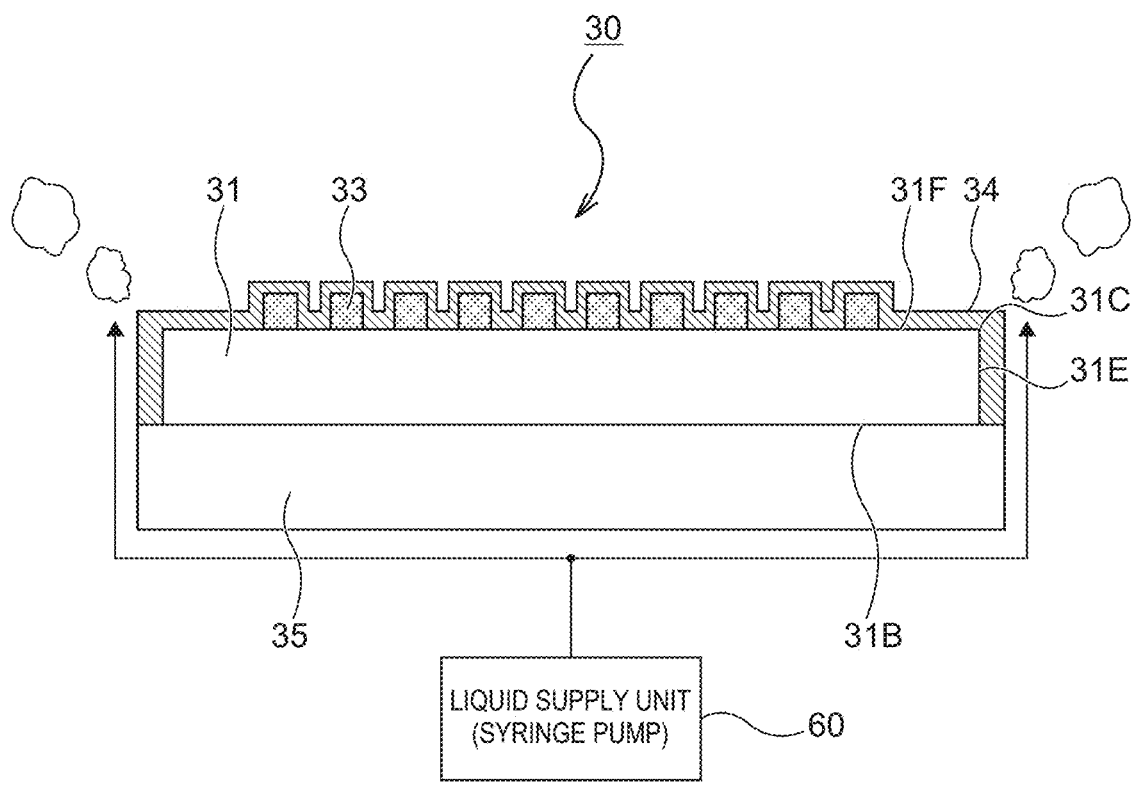
FIG. 3 is a sectional view of the SAW module.

A SAW module according to an embodiment will be explained below. FIG. 1 shows a SAW module 30 according to the embodiment. FIG. 2 is a planar view of the SAW module as viewed from a front surface side of a piezoelectric element substrate 31. FIG. 3 shows a section of the SAW module 30. The SAW module 30 is used, for example, in a flavor inhaler, not shown. The SAW module 30 atomizes liquid to be atomized which is supplied from a liquid storage portion, not shown.

As shown in FIGS. 1 to 3, the SAW module 30 includes the piezoelectric element substrate 31, an electrode (IDT comprising a body portion 32 and a comb-like electrode pair 33), a coating layer 34, and a heat dissipation mechanism 35, The piezoelectric element substrate 31 is configured to atomize liquid using SAW vibration that is generated by applying voltage to the comb-like electrode pair 33 at high frequencies (resonant frequencies).

The piezoelectric element substrate 31 includes a front surface 31F, on which the body portion 32 and the comb-like electrode pair 33 are arranged, a back surface 31B disposed on an opposite side to the front surface 31F, an end surface 31E connecting the front surface 31F and the back surface 31B, and a corner portion 31C between the front surface 31F and the end surface 31E. The piezoelectric element substrate 31 includes a piezoelectric body that is expanded/contracted by voltage application. The piezoelectric element substrate 31 includes a portion, on which the comb-like electrode pair 33 is arranged, and the portion may be referred to as an arrangement portion 30A. The piezoelectric body may form at least the front surface 31F. The piezoelectric body may comprise a known piezoelectric body made of ceramic, such as quartz, barium titanate, and lithium niobate, or another like material.

The body portion 32 is electrically connected to a power source of a flavor inhaler, not shown. The body portion 32 includes a first body portion 32A that is formed integrally with a first comb-like electrode 33A that is one of the comb-like electrode pair 33, and a second body portion 32B that is formed integrally with a second comb-like electrode 33B that is the other of the comb-like electrode pair 33. The first body portion 32A and the second body portion 32B are arranged with the arrangement portion 30A located therebetween in an orthogonal direction B to a moving direction A of the SAW. Electric power that is outputted from the power source is supplied through the body portion 32 to the comb-like electrode pair 33.

The comb-like electrode pair 33 includes the first comb-like electrode 33A and the second comb-like electrode 33B. The first comb-like electrode 33A and the second comb-like electrode 33B are alternately arranged in the moving direction A of the SAW. The first comb-like electrode 33A has a shape extending from the first body portion 32A along the orthogonal direction B. The second comb-like electrode 33B has a shape extending from the second body portion 32B along the orthogonal direction B. For example, the comb-like electrode pair 33 is made of metal formed by a sputtering method or evaporation method, or another like material.

In FIG. 3, the coating layer 34 is disposed to cover the front surface 31F, the end surface 31E, and the corner portion 31C of the piezoelectric element substrate 31. The coating layer 34 is an insulating layer that covers the piezoelectric element substrate 31, the body portion 32, and the comb-like electrode pair 33. The coating layer 34 may be partially omitted in a region of the end surface 31E of the piezoelectric substrate 31 or the like which is parallel to the moving direction A of the SAW and does not contribute to liquid atomization.

The coating layer 34 may be made of material that suppresses denaturalization of the piezoelectric element substrate 31 which is caused by liquid adhesion. The material of the coating layer 34 has a high electric resistance and a low water permeability and is equal to material of the piezoelectric element substrate 31 in Young's modulus, heat expansion coefficient, and density. For example, the coating layer 34 may be made of material such as Teflon, parylene, silicon dioxide, silicon nitride, and alumina. The coating layer 34 needs to evenly adhere to the front surface 31F, the end surface 31E, and the corner portion 31C and is therefore formed by any one of a CVD method, an ALD method, and spray coating.

Figure 4:
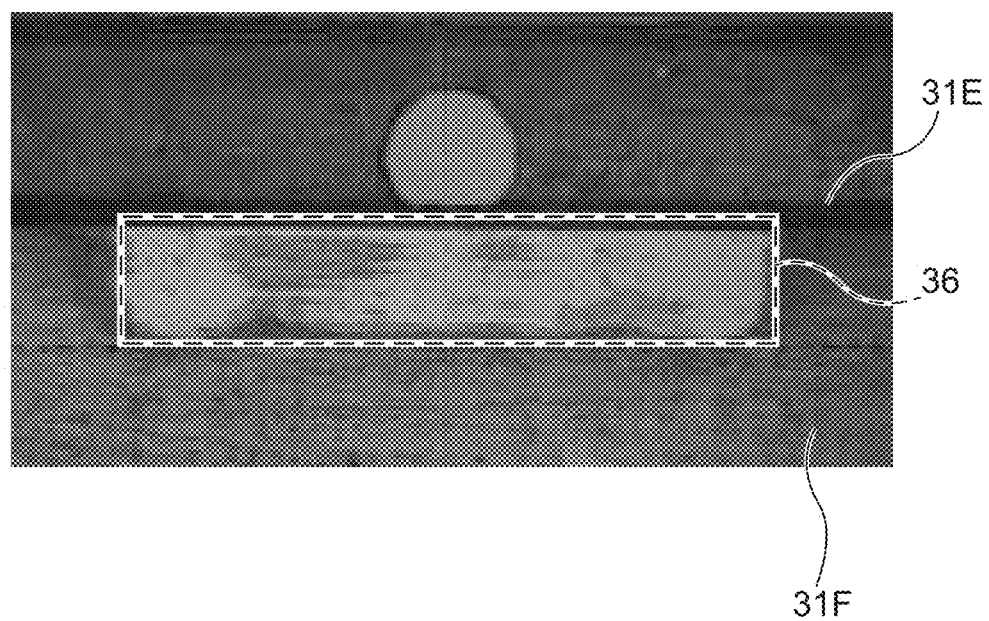
FIG. 4 shows a coating layer that is exfoliated due to SAW vibration.

As already mentioned, if the coating layer 34 is formed only on the surface of the IDT, the coating layer 34 might be exfoliated due to SAW vibration when the liquid is atomized on the end surface 31E of the piezoelectric element substrate 31. FIG. 4 shows the coating layer 34 exfoliated due to SAW vibration. In FIG. 4, an area 36 enclosed by broken lines is a region in the end surface 31E of the piezoelectric element substrate 31, to which the liquid is supplied, and from which the coating layer 34 is exfoliated due to the SAW vibration. The exfoliation is considered to occur when the liquid enters through a gap between the front surface 31F of the piezoelectric element substrate 31 and the coating layer 34 to be atomized by the SAW vibration, pushing the coating layer 34 off from the front surface 31F of the piezoelectric element substrate 31.

To solve the problem, the coating layer 34 is so disposed as to cover the front surface 31F, the end surface 31E, and the corner portion 31C of the piezoelectric element substrate 31, to thereby suppress contact of the liquid to the piezoelectric element substrate 31. The coating layer 34 may also be disposed on the back surface 31B of the piezoelectric element substrate 31 as well as the front surface 31F, the end surface 31E, and the corner portion 31C of the piezoelectric element substrate 31, Such a configuration further suppresses the contact of the liquid to the piezoelectric element substrate 31.

The coating layer 34 also covers a microcrack, if any, in the front surface 31F of the piezoelectric element substrate 31 and suppresses generation of a crack in the piezoelectric element substrate 31 due to SAW vibration. This suppression is considered to occur because the coating layer 34 suppresses the expansion/contraction of the piezoelectric element substrate 31 due to a temperature change caused by some of vibration energy.

The inventors and others involved in the invention conducted an experiment for optimizing thickness of the coating layer 34. Specifically, the inventors and the others involved in the invention provided the coating layer 34 made of silicon dioxide onto the piezoelectric element substrate 31 including lithium niobate as the piezoelectric body by a plasma CVD method, to thereby produce a SAW module, and checked if the exfoliation of the coating layer 34 and the generation of a crack in the piezoelectric element substrate 31 occurred. The coating layer 34 was provided under coating conditions that pressure was 60 Pa; temperature was 300° C.; plasma application electric power was 1.2 W/cm2; precursor (Bis (ethylmethylamino) silane) flow rate was 5 to 10 sccm; Ar flow rate was 100 sccm; O2 flow rate was 150 sccm; and ES (electrode-substrate) distance was 30 mm.

The experiment for optimizing the thickness of the coating layer 34 was conducted from the following two perspectives. One of the perspectives is that, if the coating layer 34 is small in thickness, a crack is generated, for example, in the corner portion 31C of the piezoelectric element substrate 31 due to SAW vibration, allowing the liquid to enter through the crack and cause the exfoliation of the coating layer 34, or the coating layer 34 cannot suppress the expansion/contraction of the piezoelectric element substrate 31 and allows a crack to be generated in the piezoelectric element substrate 31.

The other perspective is that, if the coating layer 34 is large in thickness, an effect of difference in heat expansion coefficient between the piezoelectric element substrate 31 and the coating layer 34 becomes more significant, which causes distortion between the piezoelectric element substrate 31 and the coating layer 34 and generates a crack in the piezoelectric element substrate 31.

Figure 5A:
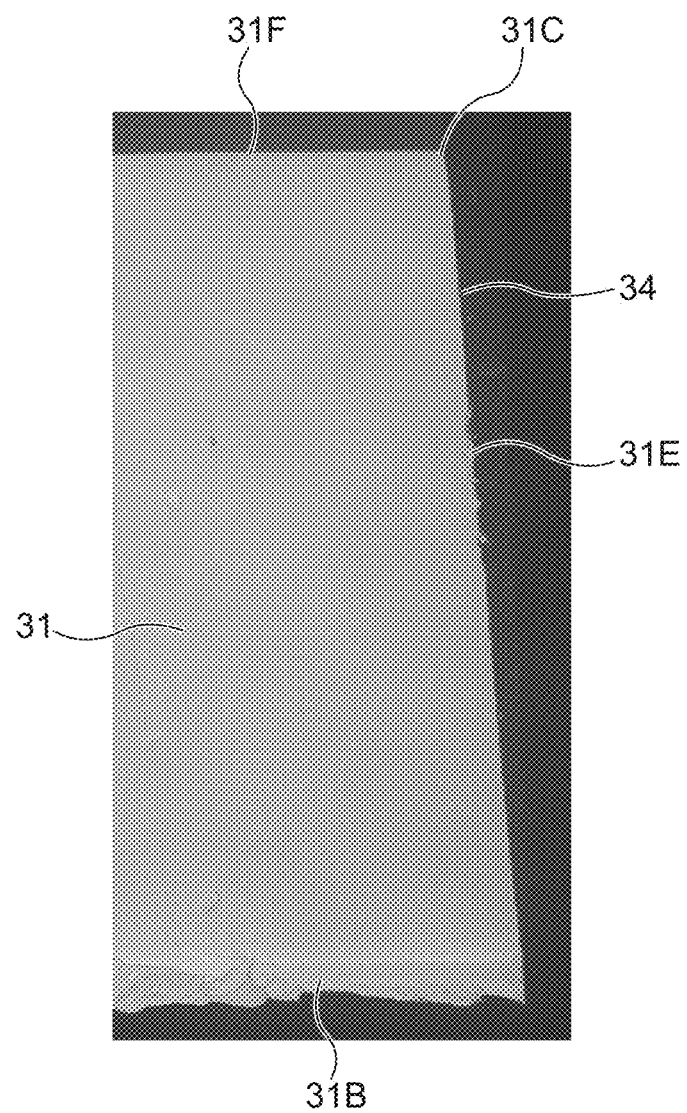
FIG. 5A shows a section of the SAW module in which a coating layer with a thickness of 1000 nm is formed on the front surface of the piezoelectric element substrate, and which was driven for 250 times.
Figure 5B:
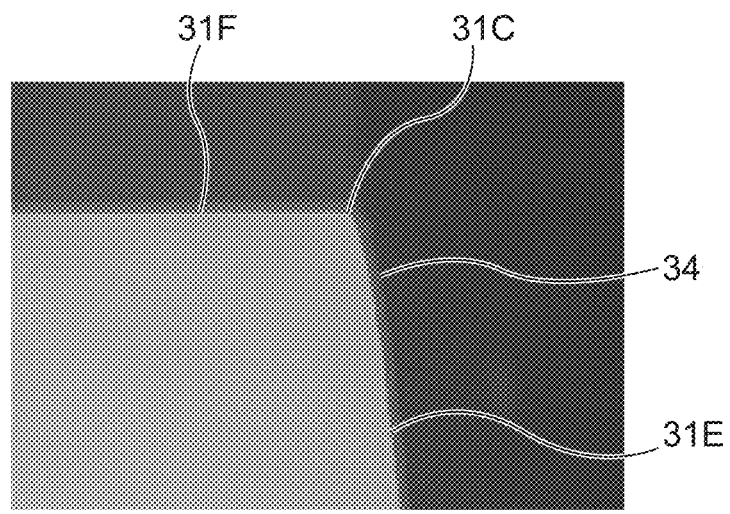
FIG. 5B shows a part of the section on a front surface side of the SAW module, in which the coating layer with a thickness of 1000 nm is formed on the front surface of the piezoelectric element substrate, and which was driven for 250 times.
Figure 5C:
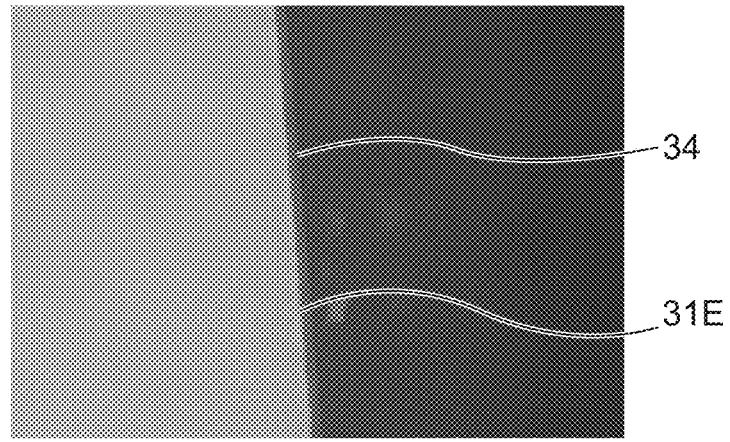
FIG. 5C shows a part of the section on an end surface of the SAW module, in which the coating layer with a thickness of 1000 nm is formed on the front surface of the piezoelectric element substrate, and which was driven for 250 times.
Figure 5D:
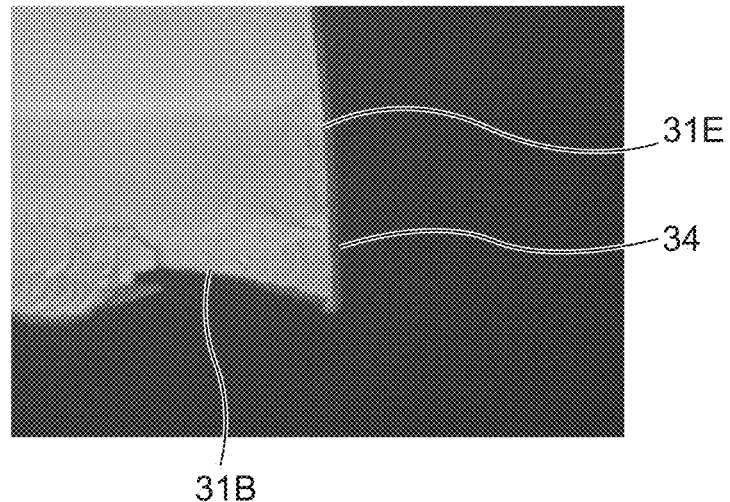
FIG. 5D shows a part of the section on a back surface side of the SAW module, in which the coating layer with a thickness of 1000 nm is formed on the front surface of the piezoelectric element substrate, and which was driven for 250 times.

FIGS. 5A to 5D show a section of the SAW module 30, in which the coating layer 34 with a thickness of 1000 nm is formed on the front surface 31F, the end surface 31E, and the corner portion 31C of the piezoelectric element substrate 31, and which was driven for 250 times (1750 sec). FIG. 5A shows the section of the SAW module 30. FIG. 5B shows a part of the section on the front surface 31F side of the SAW module 30. FIG. 5C shows a part of the section of the end surface 31E of the SAW module 30. FIG. 5D shows a part of the section on the back surface 31B side of the SAW module 30.

The SAW module 30 was driven under conditions that a liquid supply rate is 3 μl/sec and that a driving electric power is 9 W. FIGS. 5A to 5D show that, when the coating layer 34 with a thickness of 1000 nm is formed on the front surface 31F, the end surface 31E, and the corner portion 31C of the piezoelectric element substrate 31 as shown in the figures, neither the exfoliation of the coating layer 34 nor a crack in the piezoelectric element substrate 31 occurs in the front surface 31F, the end surface 31E, and the corner portion 31C of the piezoelectric element substrate 31.

FIG. 6 shows results of exfoliation of the coating layer 34 and generation of a crack in the piezoelectric element substrate 31 which are tested with respect to various thicknesses for the coating layer 34. As shown in FIG. 6, it is confirmed that neither the exfoliation of the coating layer 34 nor a crack in the piezoelectric element substrate 31 occurs in the range of 600 nm to 1400 nm thickness of the front surface 31F of the coating layer 34.

The symbol ⊚ in FIG. 6 means that neither the exfoliation of the coating layer 34 nor a crack in the piezoelectric element substrate 31 occurs even after the SAW module 30 is driven for 250 times (1750 sec). The symbol ○ means that the exfoliation of the coating layer 34 or a crack in the piezoelectric element substrate 31 occurs when the SAW module 30 is driven for about 150 times (1251) sec). The symbol X means that the exfoliation of the coating layer 34 or a crack in the piezoelectric element substrate 31 occurs when the SAW module 30 is driven for less than 10 times (50 sec). With regards to the case indicated by ○, if the driving electric power of the SAW module 30 is reduced, the coating layer 34 is less likely to be exfoliated.

Figure 7:
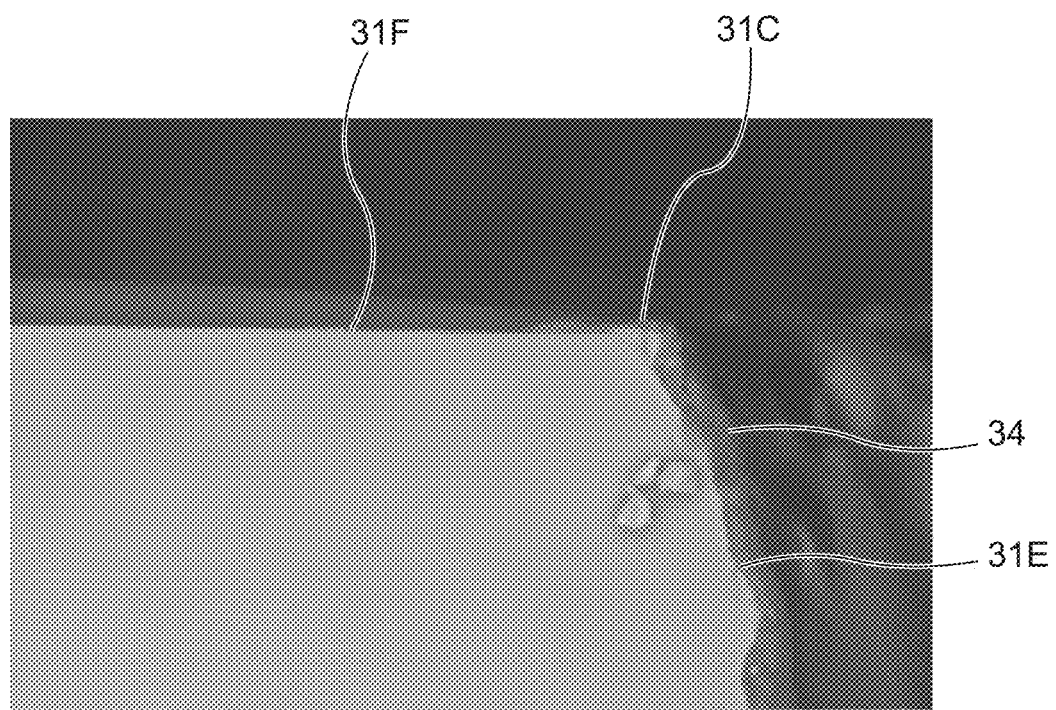
FIG. 7 shows the coating layer that is exfoliated in the end surface of the piezoelectric element substrate and the corner portion.

FIG. 7 shows the coating layer 34 exfoliated in the end surface 31E and the corner portion 31C of the piezoelectric element substrate 31. In FIG. 7, the coating layer 34 with a thickness of 1000 nm is formed on the front surface 31F of the piezoelectric element substrate 31, and the coating layer 34 with a thickness of 400 nm is formed in the end surface 31E and the corner portion 31C of the piezoelectric element substrate 31.

FIG. 7 shows that, when the coating layer 34 is thinner in the end surface 31E and the corner portion 31C of the piezoelectric element substrate 31 than in the front surface 31F of the piezoelectric element substrate 31 as shown in FIG. 7, the coating layer 34 is exfoliated in the end surface 31E and the corner portion 31C of the piezoelectric element substrate 31.

Based on the foregoing results and the fact that the coating layer 34 is more difficult to be formed in the end surface 31E and the corner portion 31C of the piezoelectric element substrate 31 than in the front surface 31F of the piezoelectric element substrate 31, the inventors and the others involved in the invention found desired thicknesses for the coating layer 34 in the front surface 31F, the end surface 31E, and the corner portion 31C of the piezoelectric element substrate 31 as below.

The optimum thickness for the coating layer 34 in the front surface 31F of the piezoelectric element substrate 31 ranges from 600 nm to 1400 nm, and preferably from 1000 nm to 1400 nm. The optimum thickness for the coating layer 34 on the end surface 31E of the piezoelectric element substrate 31 is 600 nm or more and the thickness of 50% or more of the thickness of the coating layer 34 on the front surface 31F of the piezoelectric element substrate 31. The optimum thickness of the coating layer 34 on the corner portion 31C of the piezoelectric element substrate 31 is 600 nm or more and the thickness of 50% or more of the thickness of the coating layer 34 on the front surface 31F of the piezoelectric element substrate 31.

If the thicknesses of the coating layer 34 in the front surface 31F, the end surface 31E, and the corner portion 31C of the piezoelectric element substrate 31 are set as mentioned above, the exfoliation of the coating layer 34 and the generation of a crack in the piezoelectric element substrate 31 are suppressed, which improves the SAW module 30 in durability.

Referring to FIG. 3 again, the heat dissipation mechanism 35 is a mechanism configured to conduct away heat that is generated by reflection of the surface acoustic wave in the corner portion 31C of the piezoelectric element substrate 31. The heat dissipation mechanism 35 includes at least either one of a heat dissipation layer and a Peltier element which are made of material having a higher thermal conductivity than the piezoelectric element substrate 31.

According to an example shown in FIG. 3, the heat dissipation mechanism 35 is a heat dissipation layer that is arranged on the back surface 31B of the piezoelectric element substrate 31. However, the embodiment is not limited to this configuration. For example, the heat dissipation mechanism 35 may be arranged on the front surface 31F of the piezoelectric element substrate 31 as long as the heat dissipation mechanism 35 is in contact with the piezoelectric element substrate 31. The heat dissipation mechanism 35 may be a Peltier element. The heat dissipation mechanism 35 may include both the heat dissipation layer and the Peltier element.

The heat dissipation layer may be made of, for example, metal, such as aluminum, copper, and iron, or made of carbon, aluminum nitride or ceramic. For example, the Peltier element may be bonded to the piezoelectric element substrate 31 with an adhesive agent (grease, epoxy resin or metal paste). The adhesive agent preferably has a heat conductivity that is higher than 0.1 W/m/K. More preferably, the heat conductivity of the adhesive agent is higher than 0.5 W/m/K. An adhesion layer is desirably as thinner as possible. A thin adhesion layer can be materialized by screen printing.

As shown in FIG. 3, a liquid supply unit 60 is disposed at the side of the back surface 31B of the piezoelectric element substrate 31. The liquid supply unit 60 is configured to supply liquid to the piezoelectric element substrate 31. The liquid supply unit 60 supplies liquid to the front surface 31F of the piezoelectric element substrate 31 through the end surface 31E of the piezoelectric element substrate 31. For example, the liquid supply unit 60 is a syringe pump. The syringe pump may be of a manual or electric type. The liquid supply unit 60 may be a member that supplies liquid by capillary action.

In a portion between the comb-like electrode pair 33 and the end surface 31E of the piezoelectric element substrate 31 which is supplied with liquid, at least a part of the coating layer 34 formed on the front surface 31F of the piezoelectric element substrate 31 may be made hydrophilic by later-mentioned processing for enhancing a hydrophilic property. This makes it easy for the liquid supplied from the liquid supply unit 60 to move on the front surface 31F of the piezoelectric element substrate 31 and thus facilitates the atomization of the liquid.

If the liquid storage portion is a cartridge, the liquid supply unit 60 may automatically supply the liquid to the SAW module 30 when the cartridge is installed. If a power switch for driving the flavor inhaler 1 is provided, the liquid supply unit 60 may automatically supply the liquid to the SAW module 30 when the power switch is turned on.

(Method for Manufacturing a SAW Module)

A method for manufacturing a SAW module according to the embodiment will be discussed below. First, a plurality of IDTs comprising the comb-like electrode pair 33 are formed on a front surface of a wafer of the piezoelectric element substrate 31 including the piezoelectric body. The wafer, on which the IDTs are formed, are then cut into module units for the SAW module 30.

The coating layer 34 is formed, which covers the piezoelectric element substrate 31 that is cut and the IDTs. In the step of forming the coating layer 34, the coating layer 34 is formed on the front surface 31F of the piezoelectric element substrate 31, the end surface 31E of the piezoelectric element substrate 31, and the corner portion 31C between the front surface 31F and the end surface 31E of the piezoelectric element substrate 31. At this point of time, the coating layer 34 may be formed by any one of the CVD method, the ALD method, and the spray coating. There may be the step of applying processing for enhancing a hydrophilic property to the coating layer 34. The processing for enhancing the hydrophilic property, for example, further coats the surface of the coating layer 34 with a hydrophilic material or provides fine asperities to the surface of the coating layer 34 by physical fabrication.

If the coating layer 34 covering the piezoelectric element substrate 31 and the IDTs is formed after the wafer is cut into module units for the SAW module 30 as described above, the coating layer 34 can be formed on the front surface 31F, the end surface 31E, and the corner portion 31C of the piezoelectric element substrate 31. This suppresses the exfoliation of the coating layer 34 and the generation of a crack in the piezoelectric element substrate 31 and improves the SAW module 30 in durability.

According to the flavor inhaler 1 thus configured, the SAW module 30 comprises the piezoelectric element substrate 31 including the piezoelectric body, the IDTs disposed on the front surface 31F of the piezoelectric element substrate 31 and comprising the comb-like electrode pair 33, and the coating layer 34 covering the piezoelectric element substrate 31 and the IDTs. The coating layer 34 is disposed on the front surface 31F of the piezoelectric element substrate 31, the end surface 31E of the piezoelectric element substrate 31, and the corner portion 31C between the front surface 31F of the piezoelectric element substrate 31 and the end surface 31E of the piezoelectric element substrate 31. Consequently, the exfoliation of the coating layer 34 and the generation of a crack in the piezoelectric element substrate 31 are suppressed, and the durability of the SAW module 30 is improved.

The one embodiment of the invention has been discussed. The embodiment of the invention is intended to facilitate the understanding of the invention and not to limit the invention. The invention may be modified or improved without deviating from the gist thereof. The invention includes equivalents thereof. The constituent elements mentioned in claims and description may be combined or omitted as long as the aforementioned problem is at least partially solved or as long as the advantageous effect is at least partially provided.

REFERENCE SIGN LIST

1 Flavor inhaler
30 SAW module
31 Piezoelectric element substrate
32 Body portion
33 Comb-like electrode pair
34 Coating layer
35 Heat dissipation mechanism
31B Back surface
31C Corner portion
31E End surface
31F Front surface

The invention claimed is:

1. A SAW module comprising:
a piezoelectric element substrate including a piezoelectric body; an Interdigital Transducer (IDT), disposed on a front surface of the piezoelectric element substrate and comprising a comb-like electrode pair;
a coating layer covering the piezoelectric element substrate and the IDT, wherein the coating layer is disposed on the front surface of the piezoelectric element substrate, an end surface of the piezoelectric element substrate, and a corner portion between the front surface of the piezoelectric element substrate and the end surface of the piezoelectric element substrate; and
wherein, on the end surface of the piezoelectric element substrate, the coating layer has a thickness of 600 nm or more and 50% or more of a thickness of the coating layer on the front surface of the piezoelectric element substrate.

2. The SAW module according to claim 1, wherein the coating layer has a thickness ranging from 600 nm to 1400 nm on the front surface of the piezoelectric element substrate.

3. The SAW module according to claim 1, wherein, on the corner portion, the coating layer has a thickness of 600 nm or more and 50% or more of a thickness of the coating layer on the front surface of the piezoelectric element substrate.

4. The SAW module according to claim 1, wherein the coating layer includes either one of SiO2 and SiN.

5. A flavor inhaler comprising the SAW module according to claim 1.

6. A method for manufacturing a SAW module, comprising the steps of
forming a plurality of IDTs comprising a comb-like electrode pair on a front surface of a wafer of a piezoelectric element substrate including a piezoelectric body;
cutting the wafer into module units;
forming a coating layer covering the piezoelectric element substrate that is cut and the IDTs, wherein forming the coating layer forms the coating layer on a front surface of the piezoelectric element substrate, an end surface of the piezoelectric element substrate, and a corner portion between the front surface of the piezoelectric element substrate and the end surface of the piezoelectric element substrate; and
wherein, on the end surface of the piezoelectric element substrate, the coating layer has a thickness of 600 nm or more and 50% or more of a thickness of the coating layer on the front surface of the piezoelectric element substrate.

7. The method for manufacturing the SAW module according to claim 6, wherein forming the coating layer forms the coating layer by any one of a CVD method, an ALD method, and spray coating.

8. The method for manufacturing the SAW module according to claim 6, further comprising applying processing for enhancing a hydrophilic property to the coating layer.

* * * * *